United States Patent
Hsu (10) Patent No.: US 10,637,195 B2
(45) Date of Patent: Apr. 28, 2020

(54) CORD RETAINER

(71) Applicant: Accton Technology Corporation, Hsinchu (TW)

(72) Inventor: Ming-Huai Hsu, Hsinchu (TW)

(73) Assignee: ACCTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/394,626

(22) Filed: Apr. 25, 2019

(65) Prior Publication Data
US 2020/0044391 A1    Feb. 6, 2020

(30) Foreign Application Priority Data

Aug. 6, 2018  (CN) ............. 2018 2 1259143 U (51) Int. Cl.
| | | |
|---|---|---|
| H01R 9/22 | (2006.01) | |
| H01R 13/639 | (2006.01) | |
| G06F 1/18 | (2006.01) | |
| H01R 13/72 | (2006.01) | |

(52) U.S. Cl.
CPC ............ H01R 13/639 (2013.01); G06F 1/18 (2013.01); *G06F 2200/1639* (2013.01); *H01R 13/72* (2013.01); *H01R 2201/06* (2013.01)

(58) Field of Classification Search
CPC .......................... H01R 9/223; H01R 13/5804; H01R 13/5812; H01R 13/506; H01R 13/59; H01R 13/5205
USPC ........ 439/718, 471, 470, 464, 460, 461, 462
See application file for complete search history.

(56) References Cited

U.S. PATENT DOCUMENTS

| | | | | |
|---|---|---|---|---|
| 4,058,890 A | * | 11/1977 | Pierce | H05K 7/1417 29/829 |
| 4,702,709 A | * | 10/1987 | Santilli | H01R 13/6395 174/67 |
| 6,139,366 A | * | 10/2000 | van Woensel | H01R 13/6275 439/607.19 |
| 7,101,215 B2 | * | 9/2006 | Woellner | H01R 13/639 439/371 |
| 7,220,142 B2 | * | 5/2007 | Liang | H05K 7/142 439/326 |

\* cited by examiner

*Primary Examiner* — Phuong Chi Thi Nguyen
(74) *Attorney, Agent, or Firm* — Birch, Stewart, Kolasch & Birch, LLP (57) ABSTRACT

A cord retainer is configured to be detachably disposed on an electronic device. The cord retainer includes a hook portion, a connection portion, and a clamp portion. The hook portion is configured to be fastened to the handle of the electronic device. The hook portion may be a tubular structure that extends along an extension direction. The connection portion is connected to the hook portion. The clamp portion is connected to the connection portion, and is configured to retain a cord attached on the electronic device. The clamp portion may be a plate structure that extends along an extension plane that is parallel to the extension direction.

16 Claims, 10 Drawing Sheets

CORD RETAINER

CROSS-REFERENCE TO RELATED APPLICATIONS

This Application claims priority of China Patent Application No. 201821259143.4 filed on Aug. 6, 2018, the entirety of which is incorporated by reference herein.

BACKGROUND OF THE INVENTION

Field of the Invention

The present disclosure relates to a retainer, and in particular to a cord retainer.

Description of the Related Art

A conventional modular server includes a chassis and various modules, such as power modules, network modules, and storage modules. The modules can be inserted into the chassis to provide different server functions. When the module in the server is damaged or needs to be updated, it can be replaced easily.

However, when the server is being maintained, the maintenance personnel may move the server or move around the server, having chance to cause the power cord to leave the server and causing the server to fail to operate, or to be damaged. Therefore, in the conventional art, power-cord retainers are used to prevent the power cord from coming out of the server. In addition, the conventional power-cord retainers may be too cumbersome to install, or be too costly to manufacture.

Although existing power-cord retainers have been generally adequate for their intended purposes, they have not been entirely satisfactory in all respects. Consequently, it would be desirable to provide a solution for improving the power-cord retainers.

BRIEF SUMMARY OF THE INVENTION

The present disclosure provides a cord retainer that can be easily mounted on an electronic module and has a lower cost of manufacture.

The present disclosure provides a cord retainer configured to be detachably disposed on an electronic module. The electronic device includes a handle. The cord retainer includes a hook portion, a connection portion, and a clamp portion. The hook portion is configured to be fastened to the handle. The hook portion is a tubular structure extending in an extension direction. The connection portion is connected to the hook portion. The clamp portion is connected to the connection portion, and configured to retain a cord attached on the electronic device. The clamp portion is a plate structure that extends along an extension plane that is parallel to the extension direction.

In some embodiments, the hook portion includes a fastening body, a fastening hole, and a fastening opening. The fastening body is connected to the connection portion. The fastening hole penetrates through the fastening body in the extension direction, and the fastening opening is formed on a side of the fastening body and connected to the fastening hole. The fastening hole is configured to receive the handle, and the fastening opening is perpendicular to a fastening direction that is perpendicular to the extension direction.

In some embodiments, the clamp portion includes a clamping body, a clamping hole and a clamping opening. The clamping body is connected to the connection portion. The clamping hole penetrates through the clamping body in a direction that is perpendicular to the extension plane, and the clamping opening is formed on a side of the clamping body and connected to the clamping hole. The clamping hole is configured to receive the cord, and the clamping opening is perpendicular to or substantially perpendicular to the fastening direction.

In some embodiments, the connection portion is a plate structure, and the connection portion and the clamp portion are formed as an L-shaped structure.

In some embodiments, the cord retainer further includes a support structure connected to the hook portion and the clamp portion, and configured to abut the electronic device.

In some embodiments, the support structure includes an abutment plate and an inclined plate. The abutment plate is configured to abut the electronic module. The inclined plate is connected to the abutment plate and the clamp portion. The inclined plate is inclined relative to the clamp portion and the abutment plate.

In some embodiments, the support structure includes a first support plate and a second support plate. The first support plate is connected to the abutment plate and the hook portion. The second support plate is connected to the inclined plate and the hook portion.

In some embodiments, the hook portion, the connection portion, and the clamp portion are formed as a single piece, and are made from plastic materials.

In some embodiments, the cord retainer further includes a strengthening portion connected to edges of the connection portion and the clamp portion, and perpendicular to the connection portion and the clamp portion.

In some embodiments, the cord retainer further includes a cable frame connected to the connection portion, and configured for the cord to be put thereon.

The present disclosure provides a cord retainer configured to be mounted on an electronic device with a handle. The cord retainer includes a first hook portion, a first connection portion and a clamp portion. The first hook portion is configured to be fastened to the handle. The first hook portion is tubular structure extending in an extension direction. The first connection portion is connected to the first hook portion. The clamp portion is connected to the first connection portion, and configured to retain a cord attached on the electronic module. The clamp portion is a plate structure that extends along an extension plane that is perpendicular to the extension direction.

In some embodiments, the first hook portion includes a first fastening body, a first fastening hole and a first fastening opening. The first fastening body is connected to the first connection portion. The first fastening hole penetrates through first fastening body in the extension direction. The first fastening opening is formed on a side of the first fastening body and connected to the first fastening hole. The first fastening hole is configured to receive the handle. The first connection portion extends perpendicular to the clamp portion. The extension of the first connection portion passes through the centers of the first fastening hole and the first fastening opening.

In some embodiments, the cord retainer further includes a second hook portion and a second connection portion. The second hook portion is configured to be fastened to the handle. The second hook portion is a tubular structure extending in the extension direction. The second connection portion connected to the second hook portion and the clamp portion.

In some embodiments, the second hook portion includes a second fastening body, a second fastening hole and a second fastening opening. The second fastening body is connected to the second connection portion. The second fastening hole penetrates through the second fastening body in the extension direction. The second fastening opening is formed on a side of the second fastening body, and connected to the second fastening hole. The second fastening hole is configured to receive the handle, and the second fastening opening faces the first hook portion or the first connection portion.

In some embodiments, the first hook portion, the second hook portion, the first connection portion, the second connection portion, and the clamp portion are formed as a single piece, and are made from plastic materials.

In some embodiments, the cord retainer further includes an abutment plate connected to the first connection portion, the second connection portion and the clamp portion. The abutment plate is configured to abut the electronic device. The abutment plate, the first connection portion and the second connection portion are formed as a U-shaped structure which is configured to dispose a plug of the cord when the cord is attached on the electronic device.

In conclusion, the cord retainer of the present disclosure can be easily mounted on the electronic module, and can effectively prevent the plug of the cord from coming out of the socket of the electronic module.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as upper and lower, may be used herein for ease of description to describe one element or feature's relationship to other elements or features as illustrated in the figures. The spatially relative terms are intended to encompass different orientations of the device in use or operation in addition to the orientation depicted in the figures. Moreover, the shape, size, thickness, and inclined angle depicted in the drawings may not be drawn to scale or may be simplified for clarity of discussion; these drawings are merely intended for illustration.

Figure 1:
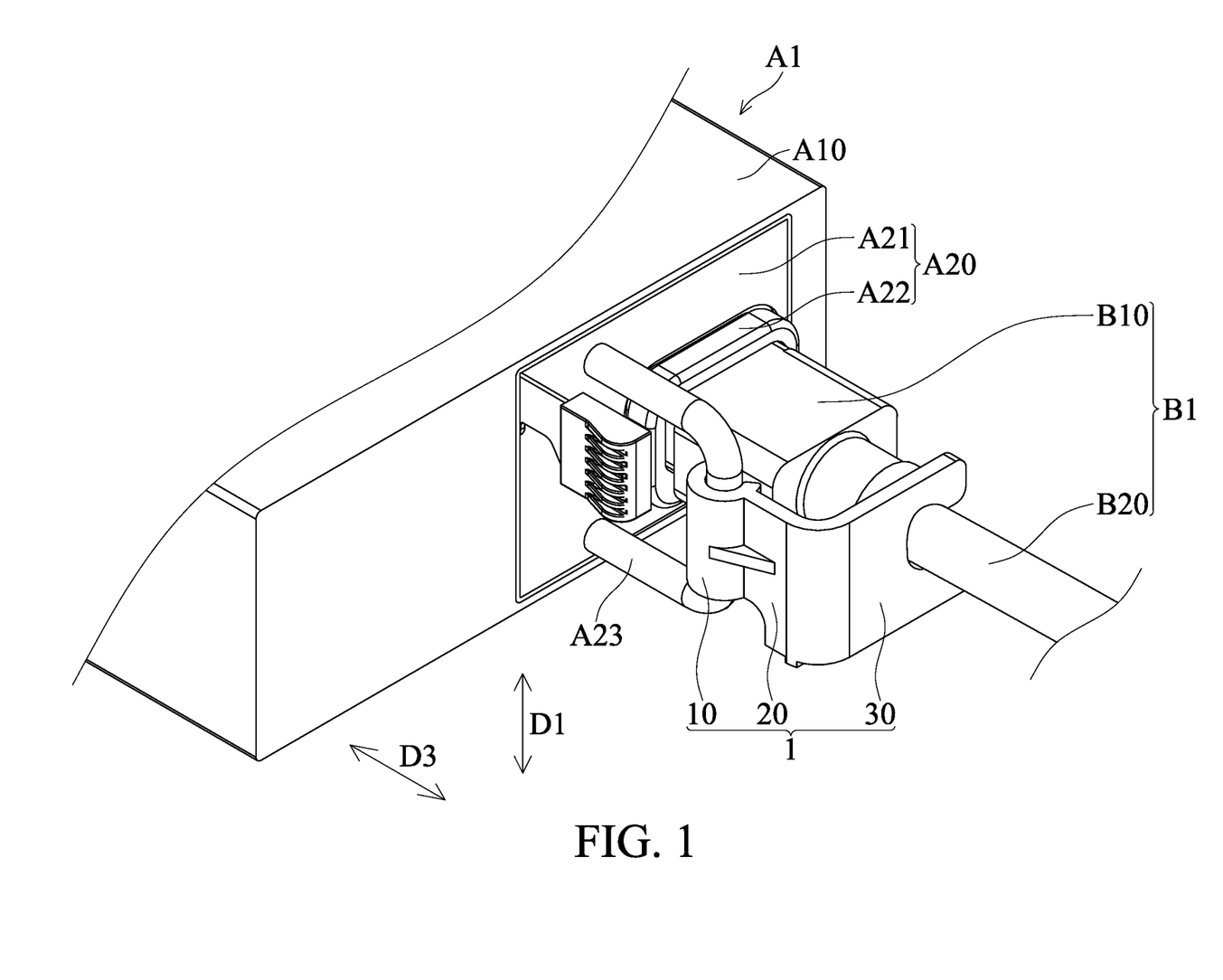
FIG. 1 is a perspective view of the electronic device and the cord retainer in accordance with a first embodiment of the disclosure, wherein the cord retainer is in a retaining position.
Figure 2:
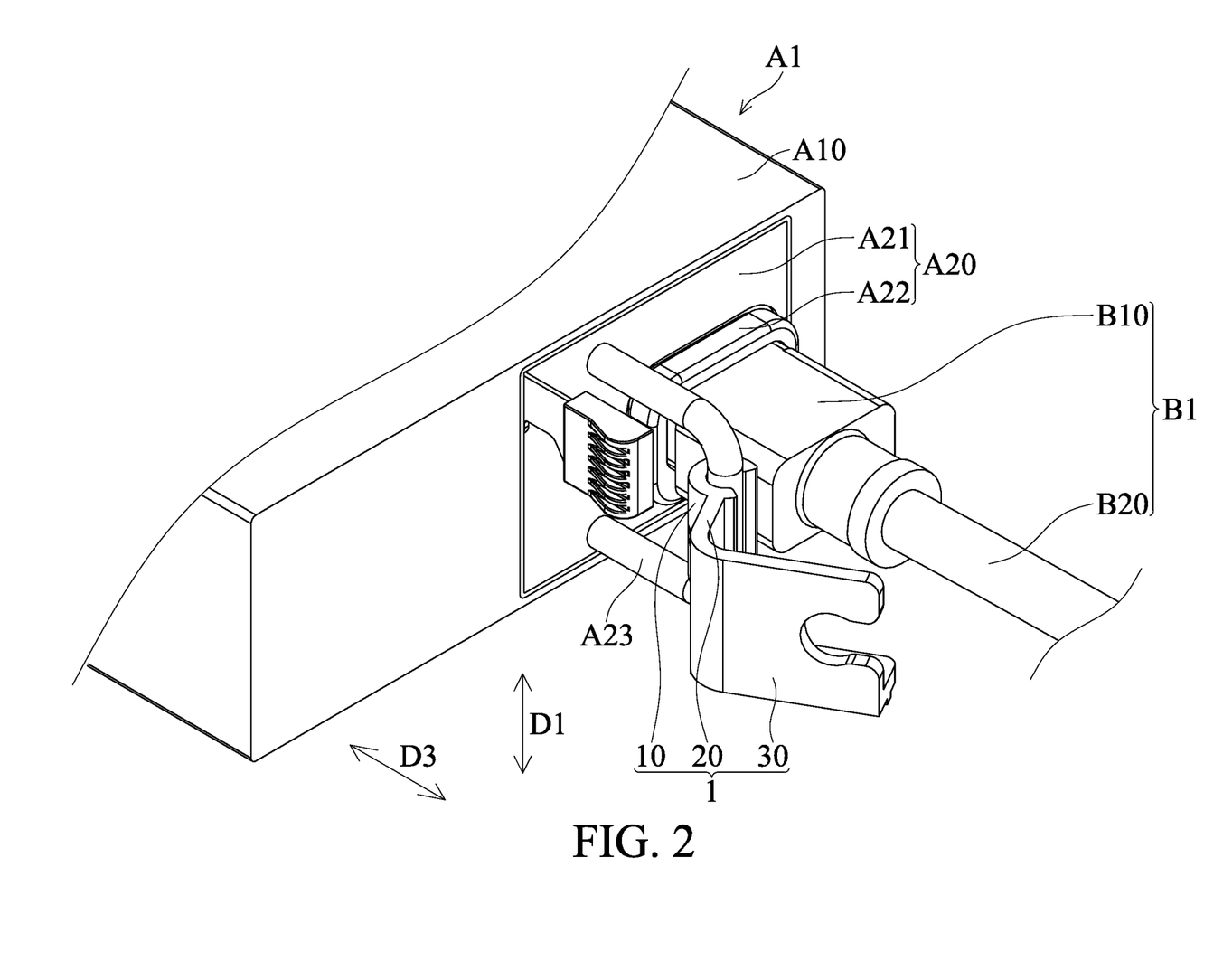
FIG. 2 is a perspective view of the electronic device and the cord retainer in accordance with the first embodiment of the disclosure, wherein the cord retainer is in the installation location, and the cord is not attached on the electronic module.

FIG. 1 is a perspective view of the electronic device A1 and the cord retainer 1 in accordance with a first embodiment of the disclosure, wherein the cord retainer 1 is in a retaining position. FIG. 2 is a perspective view of the electronic device A1 and the cord retainer 1 in accordance with the first embodiment of the disclosure, wherein the cord retainer 1 is in an installation location, and the cord B1 is not attached on the electronic module A20.

The electronic device A1 may be a computer. In the embodiment, the electronic device A1 may be a modular server or an Ethernet switch. The cord B1 is configured to attach to the electronic device A1. In some embodiments, the cord B1 is inserted into the electronic device A1, or is connected to the electronic device A1 in any detachable manner. The electronic device A1 includes a housing A10 and at least one electronic module A20.

In the embodiment, the electronic module A20 is detachably inserted into the housing A10 and may be a power supply. In some embodiments, the electronic module A20 may be a network module or a storage module, but it is not limited thereto.

The electronic module A20 includes a housing A21, a socket A22, and a handle A23. The housing A21 is detachably inserted into the housing A10. The socket A22 disposed on the housing A21 is configured for a cord B1 inserting therein. The cord B1 includes a plug B10 and a cable B20. The plug B10 is configured to plug into the socket A22. One end of the cable B20 is connected to the plug B10. In some embodiments, the cord B1 may be a power cord. In some embodiments, current (alternating current or direct current) can be supplied to the electronic module A20 via the cord B1.

The handle A23 is disposed on the housing A21 and around the socket A22. In the embodiment, the handle A23 may be a U-shaped structure. Two ends of the handle A23 are connected to the housing A21. The handle A23 may extend perpendicular to the housing A21. The user can remove the electronic module A20 from the electronic device A1 by using the handle A23.

The cord retainer 1 is configured to be detachably disposed on the electronic module A20, and configured to prevent the cord B1 from coming out of the socket A22. In some embodiments, the cord retainer 1 may be a power-cord retainer. The cord retainer 1 includes a hook portion 10, a connection portion 20, and a clamp portion 30. The hook portion 10 is configured to be fastened to the handle A23 of the electronic module A20. In the embodiment, the hook portion 10 is pivoted on the handle A23. In other words, the cord retainer 1 can be rotated relative to the electronic module A20.

The connection portion 20 is connected to the hook portion 10. The clamp portion 30 is connected to the connection portion 20, and configured to retain the cord B1, so as to prevent the cord B1 from coming out of the socket A22. As shown in FIG. 1, the clamp portion 30 retains the cable B20 and is in contact with the plug B10. When the cord B1 is pulled by arbitrary force, the clamp portion 30 will stop the plug B10 from moving, and further prevent the plug B10 from coming out of the socket A22.

As shown in FIG. 2, in case the cord retainer 1 is to be mounted on the electronic module A20, the hook portion 10 may be fastened to the handle A23 to make the cord retainer 1 be located at the installation location. Afterward, as shown in FIG. 1, rotate the cord retainer 1 in relative to the electronic module A20 so that the cable B20 of the cord B1 will be retained by clamp portion 30. Therefore, the cord retainer 1 can be easily installed.

When the cord retainer 1 is to be removed from the electronic module A20, the cord retainer 1 can be rotated from the retaining position as illustrated in FIG. 1 to the installation location as illustrated in FIG. 2. Afterwards, the hook portion 10 can be disengaged from the handle A23 by applying force to the hook portion 10, and thus the cord retainer 1 can be easily removed from the electronic module A20.

Figure 3:
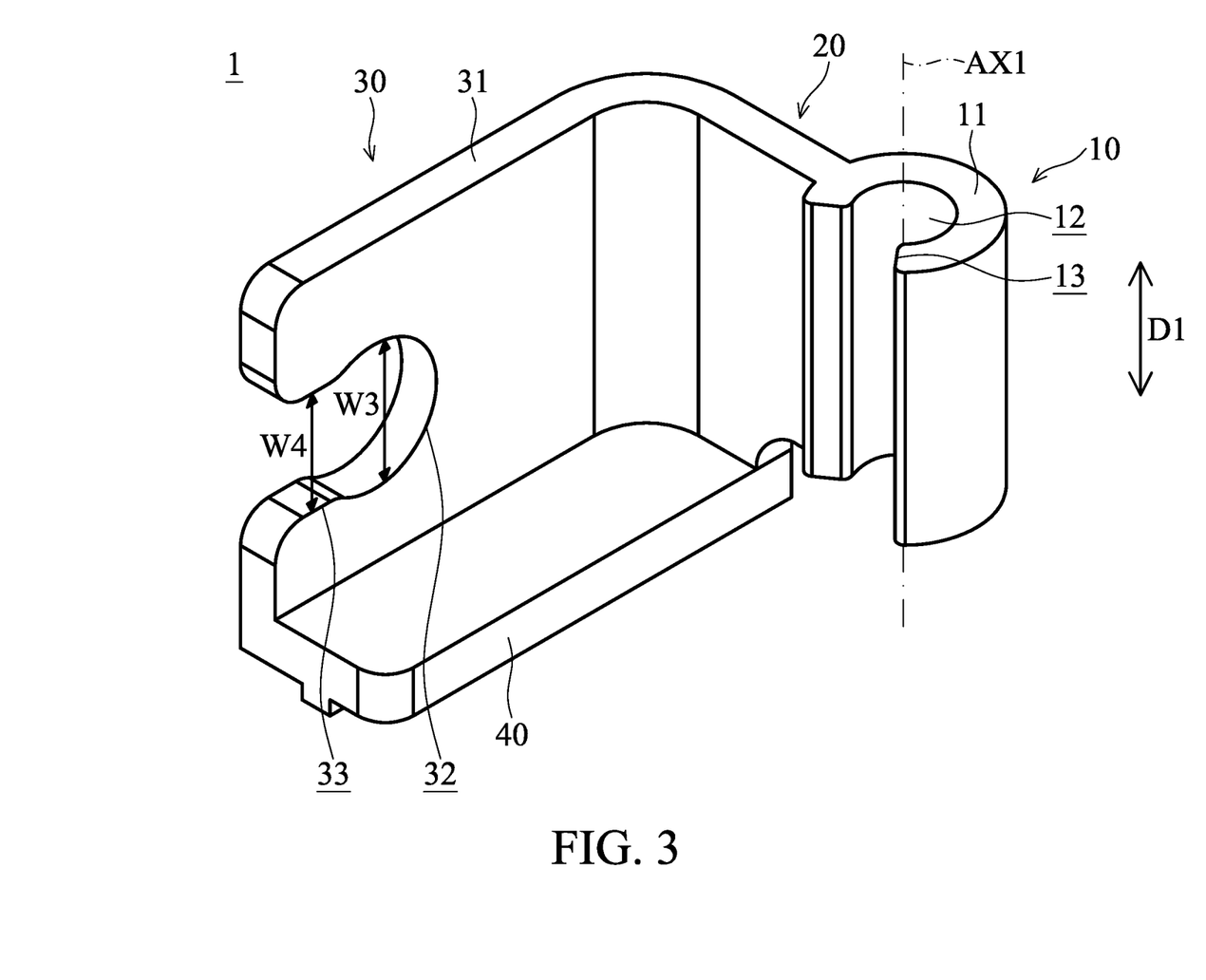
FIG. 3 is a perspective view of the cord retainer in accordance with the first embodiment of the disclosure.
Figure 4:
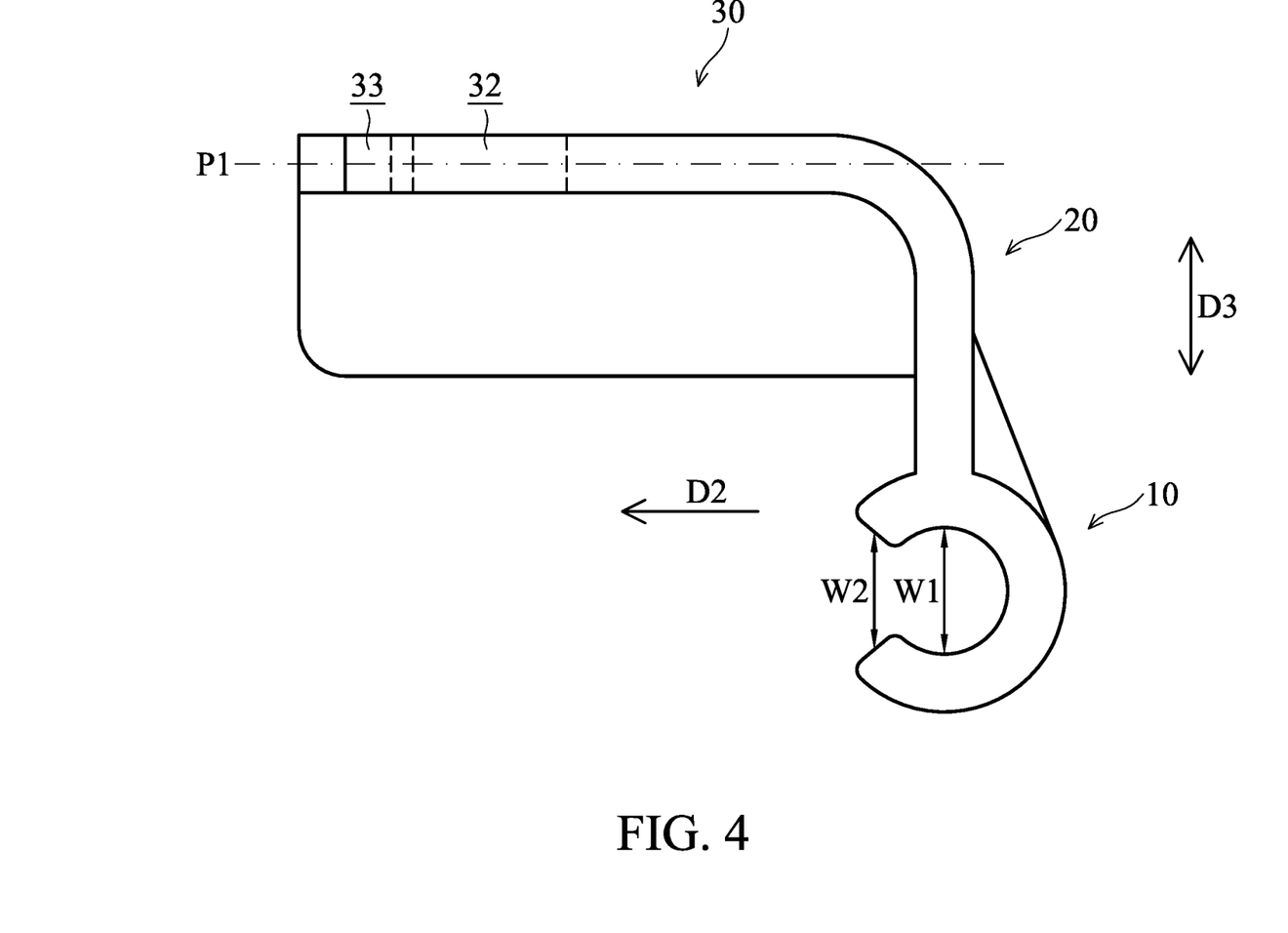
FIG. 4 is a top view of the cord retainer in accordance with the first embodiment of the disclosure.

FIG. 3 is a perspective view of the cord retainer 1 in accordance with the first embodiment of the disclosure. FIG. 4 is a top view of the cord retainer 1 in accordance with the first embodiment of the disclosure. In the disclosure, the cord retainer 1 may be formed as a single piece and made from plastic materials. Therefore, the cost of manufacturing the cord retainer 1 can be reduced. Moreover, there's no need to further assemble the cord retainer 1, improving convenience in application then.

In the embodiment, the hook portion 10 may be a tubular structure, and extends in an extension direction D1. The hook portion 10 includes a fastening body 11, a fastening hole 12 and a fastening opening 13. The fastening body 11 may extend in the extension direction D1 and may be a columnar structure. The fastening hole 12 may penetrate through fastening body 11 in the extension direction D1. The fastening opening 13 is formed on a side of the fastening body 11, and connected to the fastening hole 12. Moreover, the fastening opening 13 may penetrate through the fastening body 11 in the extension direction D1.

The fastening hole 12 is configured to receive the handle A23. When the cord retainer 1 is disposed on the electronic module A20, at least part of the handle A23 is accommodated in the fastening hole 12. In the embodiment, the longest width W1 of the fastening hole 12 is greater than the width W2 of the shortest fastening hole 12. Therefore, the cord retainer 1 will not easily slip out from the handle A23 when the fastening hole receives the handle A23. The widths W1 and W2 are measured in a direction that is perpendicular to the extension direction D1.

The connection portion 20 is connected to the fastening body 11. In the embodiment, the connection portion 20 may be a plate structure and extends in the extension direction D1. The connection portion 20 is perpendicular to or substantially perpendicular to the clamp portion 30. In other words, the connection portion 20 and the clamp portion 30 may be formed as an L-shaped structure. The extension of the connection portion 20 may pass through the central axis AX1 of the fastening hole 12. The central axis AX1 may extend in the extension direction D1, and the cord retainer 1 can be rotated relative to the electronic module A20 about the central axis AX1.

The clamp portion 30 may be a plate structure and extends along an extension plane P1. The extension direction D1 may be parallel to the extension plane P1. The clamp portion 30 includes a clamping body 31, a clamping hole 32 and a clamping opening 33. The clamping body 31 is connected to the connection portion 20. The clamping body 31 may be a plate structure extending in the extension plane P1. The clamping hole 32 penetrate through clamping body 31 in a direction that is perpendicular to the extension plane P1. The clamping opening 33 is formed on a side of the clamping body 31 and connected to the clamping hole 32. Moreover, the clamping opening 33 penetrates through clamping body 31 in a direction that is perpendicular to the extension plane P1.

The clamping hole 32 is configured to receive the cable B20. When the cord retainer 1 is disposed on the electronic module A20, the cable B20 is located in the clamping hole 32. In the embodiment, the width W3 of the clamping hole 32 is greater than the width W4 of the clamping hole 32. Therefore, the cable B20 will not easily fall off the cord retainer 1 when the cable B20 is located in the clamping hole 32. The widths W3 and W4 are measured in the extension direction D1.

The fastening opening 13 and the clamping opening 33 face or substantially face towards the same fastening direction D2. The fastening direction D2 may be perpendicular to the extension direction D1 and/or parallel to the extension plane P1. By the fastening opening 13 and the clamping opening 33, the cord retainer 1 will not easily fall off the cord B1 or the electronic module A20 when the plug B10 is pushed unintentionally.

In the embodiment, the cord retainer 1 further includes a strengthening portion 40 connected to edges of the connection portion 20 and the clamp portion 30. In the embodiment, the strengthening portion 40 may be a plate structure, and perpendicular to the connection portion 20 and the clamping body 31.

The strengthening portion 40 can strengthen the cord retainer 1 and prevent the part between the connection portion 20 and the clamp portion 30 from excessive bending. In some embodiments, the strengthening portion 40 is located under the plug B10 and supports the plug B10, so as to prevent the plug B10 from coming out of the socket A22.

In the embodiment, the hook portion 10, the connection portion 20, the clamp portion 30, and the strengthening portion 40 may be formed as a single piece, and made from plastic materials.

Figure 5:
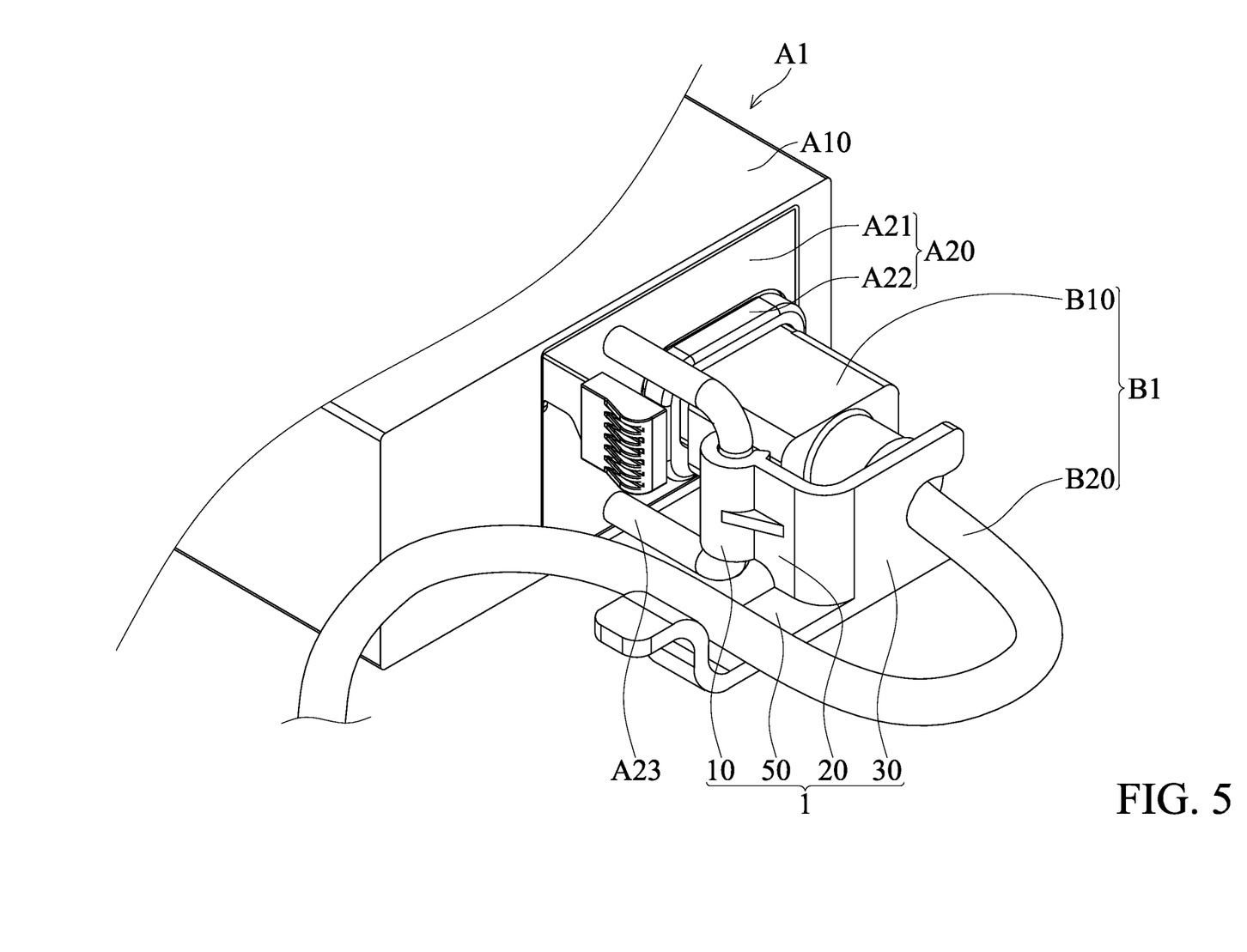
FIG. 5 is a perspective view of the electronic module and the cord retainer in accordance with the second embodiment of the disclosure.
Figure 6:
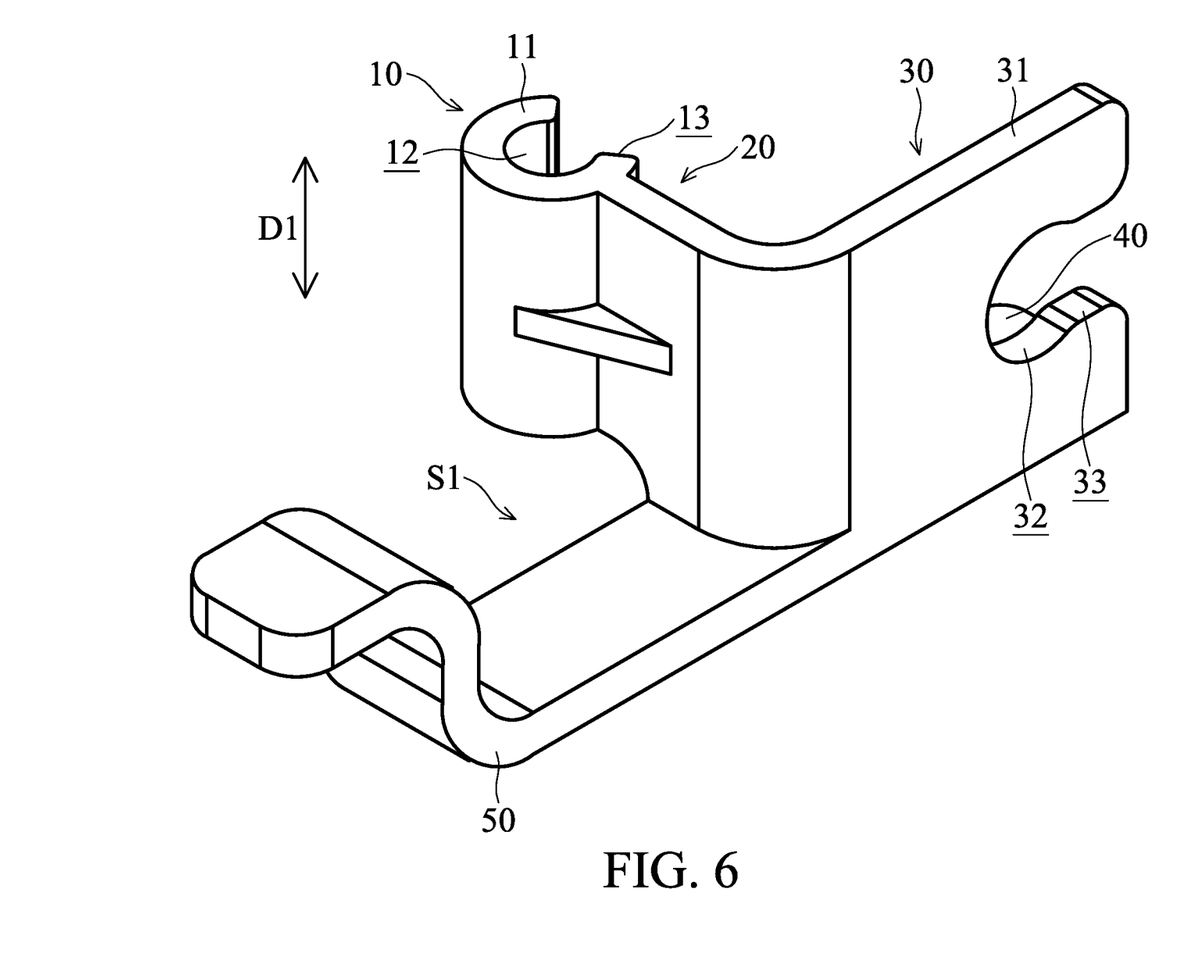
FIG. 6 is a perspective view of the cord retainer in accordance with the second embodiment of the disclosure.

FIG. 5 is a perspective view of the electronic module A20 and the cord retainer 1 in accordance with the second embodiment of the disclosure. FIG. 6 is a perspective view of the cord retainer 1 in accordance with the second embodiment of the disclosure. The cable frame 50 is connected to the connection portion 20 and configured for the cable B20 to be put thereon so as to arrange the cable B20. In the embodiment, the cable frame 50 may be a Z-shaped structure. A receiving space S1 may be formed between the cable frame 50 and the cord retainer 1. The cable B20 can be putted in the receiving space S1.

In the embodiment, the hook portion 10, the connection portion 20, the clamp portion 30, the strengthening portion 40, and the cable frame 50 may be formed as a single piece and may be made from plastic materials.

Figure 7:
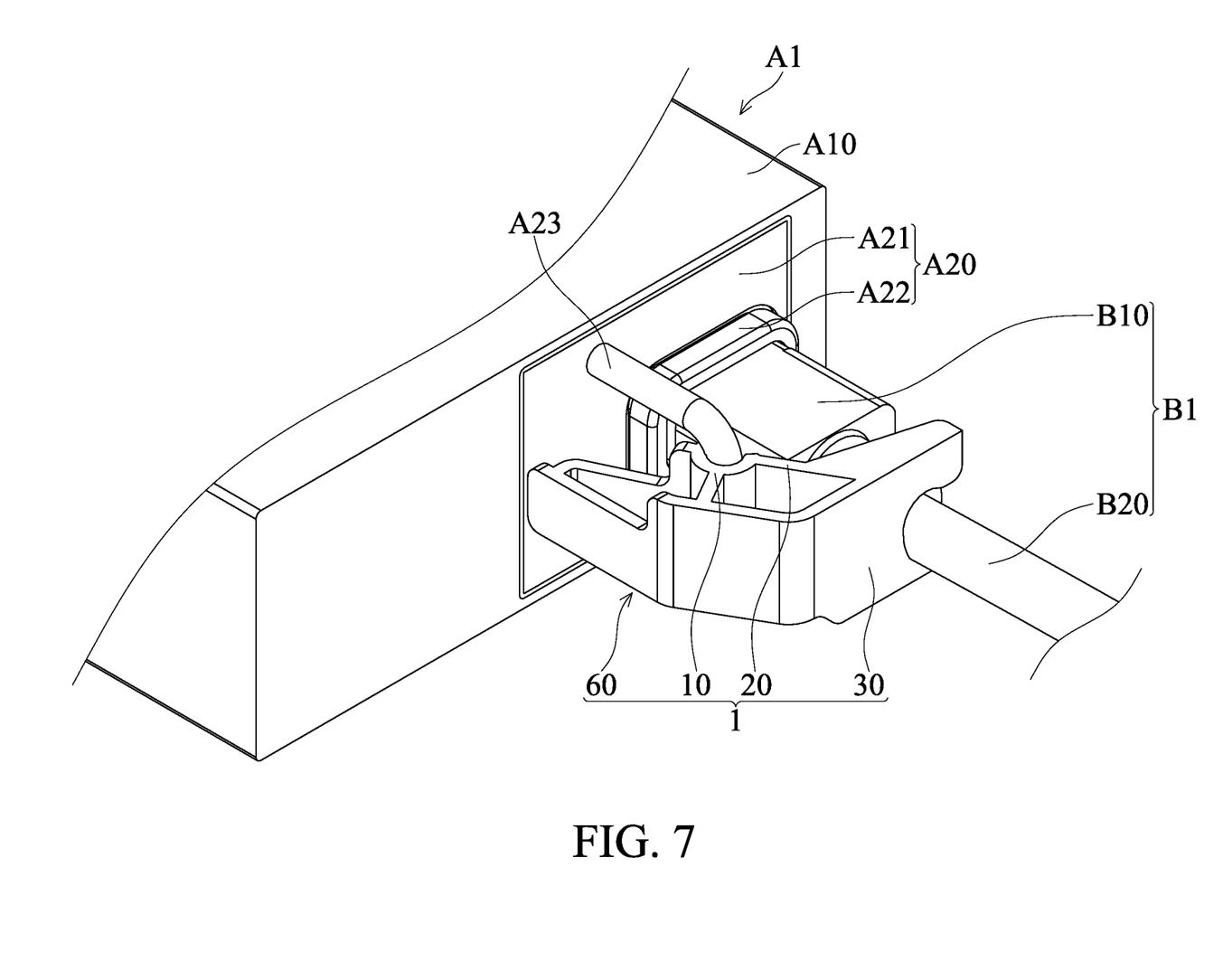
FIG. 7 is a perspective view of the electronic module and the cord retainer in accordance with the third embodiment of the disclosure.
Figure 8:
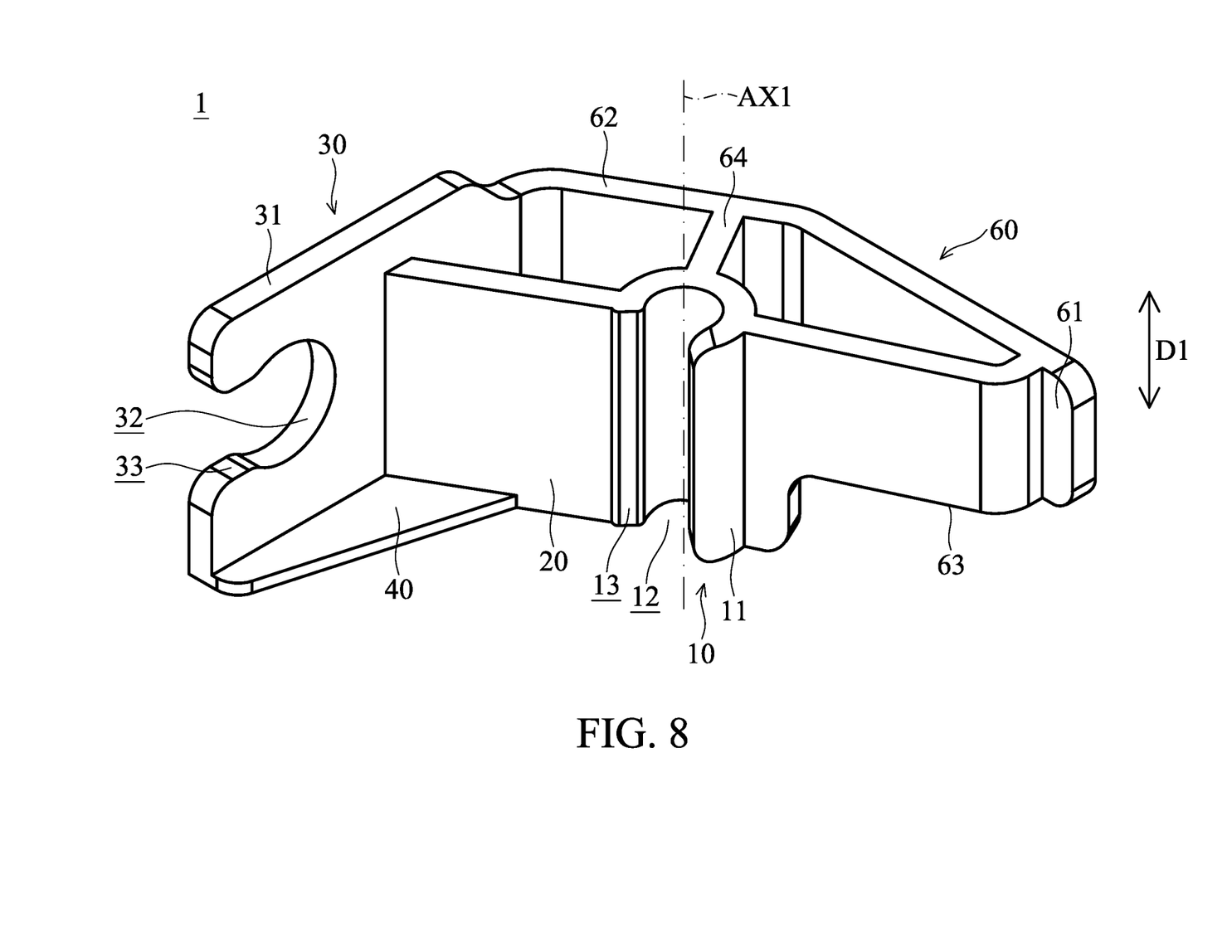
FIG. 8 is a perspective view of the cord retainer in accordance with the third embodiment of the disclosure.

FIG. 7 is a perspective view of the electronic module A20 and the cord retainer 1 in accordance with the third embodiment of the disclosure. FIG. 8 is a perspective view of the cord retainer 1 in accordance with the third embodiment of the disclosure. In the embodiment, the cord retainer 1 further includes a support structure 60 connected to the hook portion 10 and the clamp portion 30. The support structure 60 is configured to abut the housing A21 of the electronic module A20. When the cord retainer 1 is disposed on the electronic module A20, the support structure 60 can limit the rotation of the cord retainer 1, as can prevent the clamp portion 30 from coming out of the cable B20.

In the embodiment, the hook portion 10, the connection portion 20, the clamp portion 30, the strengthening portion 40, and the support structure 60 may be formed as a single piece, and made from plastic materials.

The support structure 60 includes an abutment plate 61, an inclined plate 62, a first support plate 63 and a second support plate 64. The abutment plate 61 is configured to abut the housing A21 of the electronic module A20. The extension of the abutment plate 61 may extends perpendicular to the extension of the clamp portion 30. The inclined plate 62 may be connected to the edges of the abutment plate 61 and the clamp portion 30.

The first support plate 63 is connected to the abutment plate 61 and the hook portion 10. The second support plate 64 is connected to the inclined plate 62 and the hook portion 10. The first support plate 63 and the second support plate 64 can strengthen the strength of the cord retainer 1 to prevent the abutment plate 61 and the inclined plate 62 from bending relative to the clamp portion 30. In the embodiment, the first support plate 63 and the second support plate 64 may pass through the central axis AX1 of the fastening hole 12.

Figure 9:
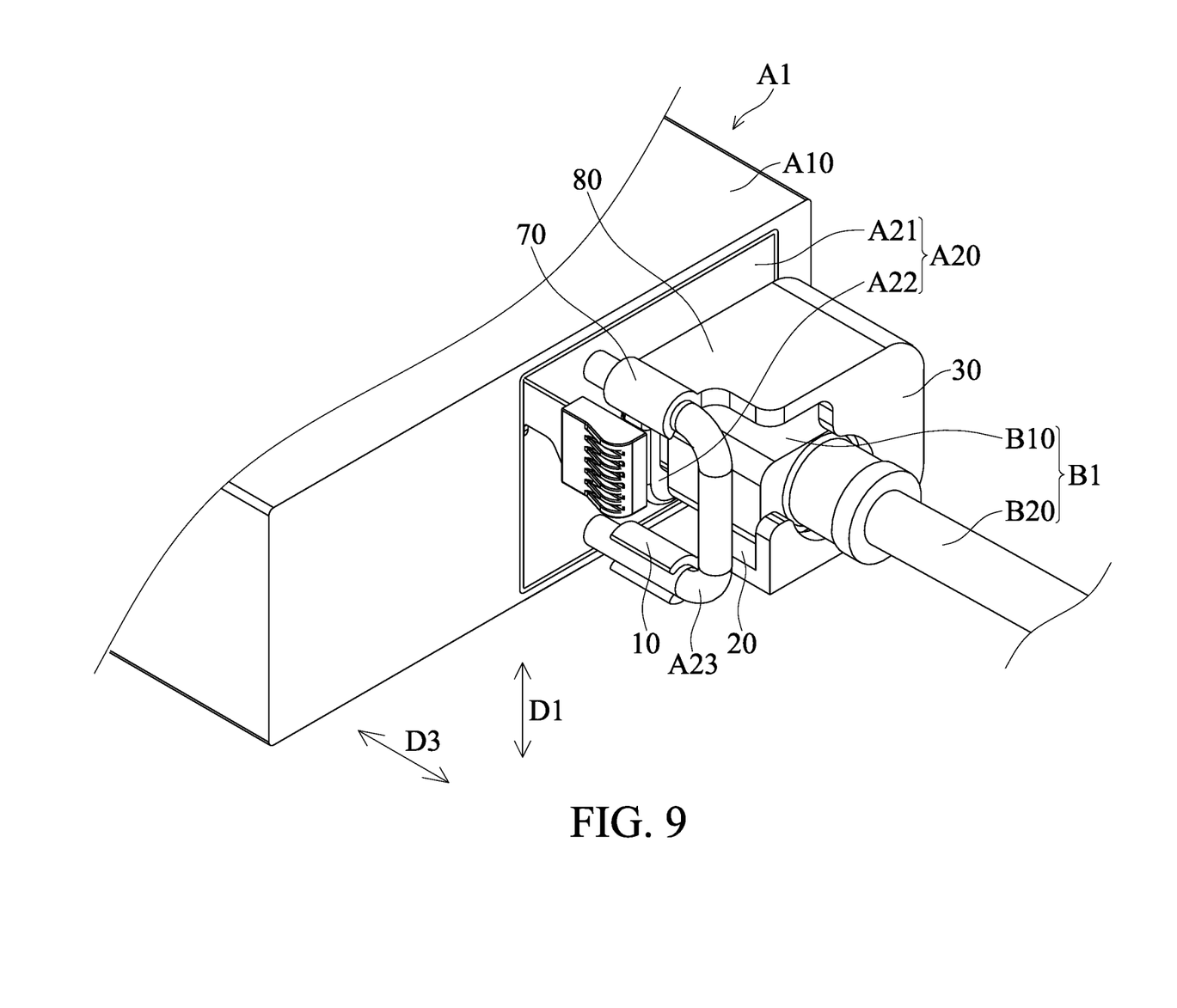
FIG. 9 is a perspective view of the electronic module and the cord retainer in accordance with the fourth embodiment of the disclosure.
Figure 10:
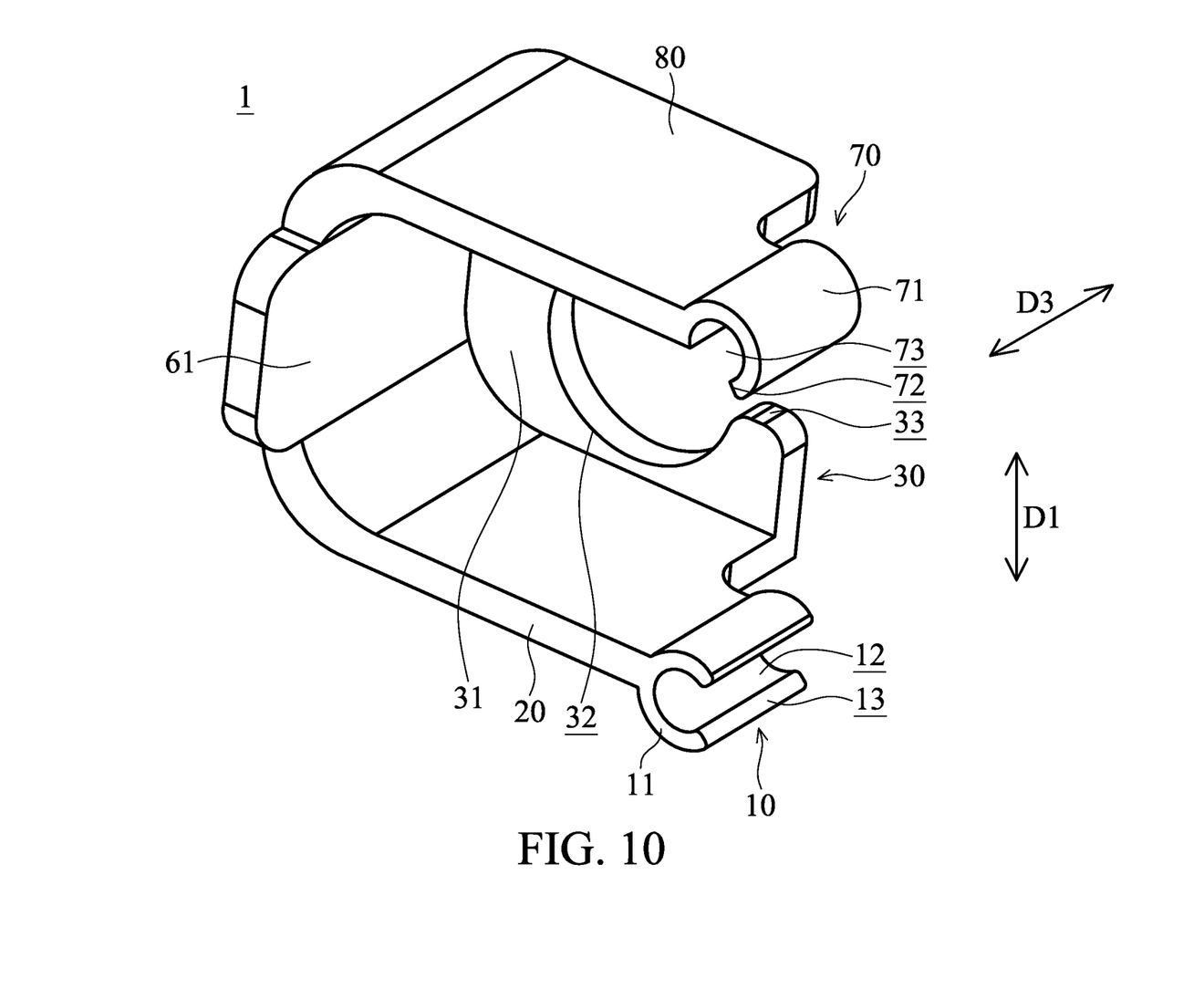
FIG. 10 is a perspective view of the cord retainer in accordance with the fourth embodiment of the disclosure.

FIG. 9 is a perspective view of the electronic module A20 and the cord retainer 1 in accordance with the fourth embodiment of the disclosure. FIG. 10 is a perspective view of the cord retainer 1 in accordance with the fourth embodiment of the disclosure. In the embodiment, the extension of the hook portion 10 is perpendicular to the extension of the clamp portion 30. In other words, the hook portion 10 extends in the extension direction D3 which is perpendicular to the extension direction D1. In the embodiment, the extension direction D3 is perpendicular to the extension plane P1 (as shown in FIG. 4).

In the embodiment, the cord retainer 1 further includes a hook portion 70 and a connection portion 80. The hook portion 70 may be a tubular structure extending in the extension direction D3. The hook portion 70 is configured to be fastened to the handle A23 of the electronic module A20. The connection portion 80 is connected to the hook portion 70 and the clamp portion 30. In the embodiment, the connection portion 80 may be parallel to the connection portion 20 and perpendicular to the clamp portion 30.

In the embodiment, the hook portion 70 includes a fastening body 71, a fastening hole 72 and a fastening opening 73. The fastening body 71 extends in the extension direction D3 and may be a columnar structure. The fastening hole 72 may penetrate through the fastening body 71 in the extension direction D3. The fastening opening 73 is formed on a side of the fastening body 71 and connected to the fastening hole 72. Moreover, the fastening opening 73 may penetrate through the fastening body 71 in the extension direction D3.

The hook portion 10, the connection portion 20, the clamp portion 30, the hook portion 70, and the connection portion 80 may be formed as a single piece and made from plastic materials.

The fastening hole 72 is configured to receive the handle A23. When the cord retainer 1 is disposed on the electronic module A20, the fastening hole 72 accommodates the handle A23. In the embodiment, the fastening opening 73 faces the hook portion 10 or the connection portion 20. By the orientation of the fastening opening 73, the cord retainer 1 can be conveniently and firmly disposed on the electronic module A20.

When the cord retainer 1 is to be disposed on the electronic module A20, the hook portion 10 can be fastened to the handle A23. Afterward, the cord retainer 1 can be rotated so as to move the plug B10 to a location between the connection portion 20 and the connection portion 80, and make the hook portion 70 adjacent to the handle A23. Finally, the hook portion 70 can be fastened to the handle A23.

In the embodiment, the cord retainer 1 further includes an abutment plate 61 configured to abut the electronic module A20. The abutment plate 61 may be connected to the connection portion 20, the connection portion 80 and the clamp portion 30. The abutment plate 61, the connection portion 20 and the connection portion 80 may be formed as a U-shaped structure.

When the cord retainer 1 is disposed on the electronic module A20, the plug B10 of the cord B1 is located among the connection portion 20, the connection portion 80, the abutment plate 61, and the clamp portion 30, so as to block the movement of the socket A22.

Moreover, when the cord retainer 1 is disposed on the electronic module A20, the abutment plate 61 is closer to the housing A21 in comparison to the connection portion 20 and the connection portion 80 and abuts the housing A21. By limiting the movement of the cord retainer 1 relative to the housing A21, it can prevent the cord B1 from coming out of the socket A22.

In conclusion, the cord retainer of the present disclosure can be easily mounted on an electronic module, and can effectively prevent the plug of the cord from coming out of the socket of the electronic module.

The disclosed features may be combined, modified, or replaced in any suitable manner in one or more disclosed embodiments, but are not limited to any particular embodiments.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cord retainer configured to be detachably disposed on an electronic device with a handle, wherein the cord retainer comprises:
   a hook portion configured to be fastened to the handle, wherein the hook portion is a tubular structure extending in an extension direction;
   a connection portion connected to the hook portion; and
   a clamp portion connected to the connection portion, and configured to retain a cord attached on the electronic device, wherein the clamp portion is a plate structure that extends along an extension plane that is parallel to the extension direction;

wherein the hook portion comprises a fastening body, a fastening hole and a fastening opening, wherein the fastening body is connected to the connection portion, the fastening hole penetrates through the fastening body in the extension direction, and the fastening opening is formed on a side of the fastening body and connected to the fastening hole;

wherein the fastening hole is configured to receive the handle, and the fastening opening is perpendicular to a fastening direction that is perpendicular to the extension direction.

2. The cord retainer as claimed in claim 1 wherein the clamp portion comprises a clamping body, a clamping hole and a clamping opening, wherein the clamping body is connected to the connection portion, the clamping hole penetrates through clamping body in a direction that is perpendicular to the extension plane, and the clamping opening is formed on a side of the clamping body and connected to the clamping hole;

wherein the clamping hole is configured to receive the cord, and the clamping opening is perpendicular to or substantially perpendicular to the fastening direction.

3. The cord retainer as claimed in claim 1, wherein the connection portion is a plate structure, and the connection portion and the clamp portion are formed as an L-shaped structure.

4. The cord retainer as claimed in claim 1, wherein the hook portion, the connection portion, and the clamp portion are formed as a single piece, and are made from plastic materials.

5. The cord retainer as claimed in claim 1, further comprising a strengthening portion connected to edges of the connection portion and the clamp portion, and perpendicular to the connection portion and the clamp portion.

6. The cord retainer as claimed in claim 1, further comprising a cable frame connected to the connection portion, and configured for the cord to be put thereon.

7. The cord retainer as claimed in claim 1, further comprising a support structure connected to the hook portion and the clamp portion, and configured to abut the electronic device.

8. The cord retainer as claimed in claim 7, wherein the support structure comprises:

an abutment plate configured to abut the electronic device; and an inclined plate connected to the abutment plate and the clamp portion;

wherein the inclined plate is inclined relative to the clamp portion and the abutment plate.

9. The cord retainer as claimed in claim 7, wherein the support structure comprises:

a first support plate connected to the abutment plate and the hook portion; and a second support plate connected to the inclined plate and the hook portion.

10. A cord retainer configured to be mounted on an electronic device with a handle, wherein the cord retainer comprises:

a first hook portion configured to be fastened to the handle, wherein the first hook portion is tubular structure extending in an extension direction; a first connection portion connected to the first hook portion; and a clamp portion connected to the first connection portion, and configured to retain a cord attached on the electronic device, wherein the clamp portion is a plate structure that extends along an extension plane that is perpendicular to the extension direction;

wherein the first hook portion comprises a first fastening body, a first fastening hole and a first fastening opening, wherein the first fastening body is connected to the first connection portion, the first fastening hole penetrates through the first fastening body in the extension direction, and the first fastening opening is formed on a side of the first fastening body and connected to the first fastening hole;

wherein the first fastening hole is configured to receive the handle, the first connection portion extends perpendicular to the clamp portion, and an extension of the first connection portion passes through centers of the first fastening hole and the first fastening opening.

11. The cord retainer as claimed in claim 10, further comprising:

a second hook portion configured to be fastened to the handle, wherein the second hook portion is a tubular structure extending in the extension direction; and a second connection portion connected to the second hook portion and the clamp portion.

12. The cord retainer as claimed in claim 11, wherein the first hook portion, the second hook portion, the first connection portion, the second connection portion, and the clamp portion are formed as a single piece, and made from plastic materials.

13. The cord retainer as claimed in claim 11, further comprising an abutment plate connected to the first connection portion, the second connection portion and the clamp portion, wherein the abutment plate is configured to abut the electronic device, wherein the abutment plate, the first connection portion and the second connection portion are formed as a U-shaped structure which is configured to dispose a plug of the cord when the cord is attached on the electronic device.

14. The cord retainer as claimed in claim 11, wherein the second hook portion includes a second fastening body, a second fastening hole and a second fastening opening, wherein the second fastening body is connected to the second connection portion, the second fastening hole penetrates through the second fastening body in the extension direction, and the second fastening opening is formed on a side of the second fastening body, and connected to the second fastening hole.

15. The cord retainer as claimed in claim 14, wherein the second fastening hole is configured to receive the handle, and the second fastening opening faces the first hook portion.

16. The cord retainer as claimed in claim 14, wherein the second fastening hole is configured to receive the handle, and the second fastening opening faces the first connection portion.

* * * * *